United States Patent [19]

Nelson et al.

[11] Patent Number: 5,686,915
[45] Date of Patent: Nov. 11, 1997

[54] INTERLEAVED HUFFMAN ENCODING AND DECODING METHOD

[75] Inventors: Frank M. Nelson, Sherman Oaks; Thanh D. Truong, Walnut; Vinod Kadakia, Rancho Palos Verdes, all of Calif.

[73] Assignee: Xerox Corporation, Stamford, Conn.

[21] Appl. No.: 579,113

[22] Filed: Dec. 27, 1995

[51] Int. Cl.$^6$ .................................................. H03M 7/40
[52] U.S. Cl. ....................................... 341/65; 341/67
[58] Field of Search ................................. 341/15, 67

[56] References Cited

U.S. PATENT DOCUMENTS

| | | | |
|---|---|---|---|
| 4,115,768 | 9/1978 | Eggenberger et al. | 340/347 |
| 4,499,498 | 2/1985 | Iinuma | 358/261 |
| 4,716,471 | 12/1987 | Yokomizo | 358/296 |
| 5,225,832 | 7/1993 | Wang et al. | 341/67 |
| 5,280,349 | 1/1994 | Wang et al. | 358/133 |

*Primary Examiner*—Jeffrey A. Gaffin
*Assistant Examiner*—Jason H. Vick
*Attorney, Agent, or Firm*—Robert Cunha

[57] ABSTRACT

A method of decoding Huffman-encoded words at the rate of one per clock cycle. The encoded words are formed into two strings of bits, one for odd numbered code and one for even numbered code, and two decoders in parallel are used, each first shifting in a number of coded bits during a first clock period, and converting the Huffman code to data on a second clock period. The two parallel decoders are timed so that the shift cycle of one decoder occurs at the same time as the conversion cycle of the other. Finally, the two streams of decoded data words are combined into one stream. The result is one output data word per clock cycle.

1 Claim, 3 Drawing Sheets

INTERLEAVED HUFFMAN ENCODING AND DECODING METHOD

BACKGROUND OF THE INVENTION

An encoding method comprising the encoding of one stream of data into Huffman codes and separating the codes into lists of odd and even numbered codes, and then decoding these lists by decoding the two lists in parallel and recombining the data into one data stream.

Huffman coders assign the shortest codes to the most frequently used numbers. Therefore, the code for a common digital number, such as "512", would most likely be a smaller number than for a relatively rare number, like "511". This results in data compression, but time is required to code and decode the data, and system throughput may become limited.

The problem is more difficult in the decoder than in the encoder since the decoder can not process data in parallel. That is, in the coder the consecutive code words can be created in parallel since the coder knows prior to coding exactly where each input word starts and ends. However, since the code words are of variable length, the decoder does not know where the next code word starts until the current one is decoded. A system which lets the decoder split the data into two streams and process both in parallel would be advantageous.

There are systems which add tag bits to the coded data to inform the decoder where the end of certain codes are, or where the end of certain strings of codes are. This allows the data to be divided up into strings which can be decoded in parallel, but adds additional data to the encoded strings, which partially defeats the reason for compressing the data in the first place. A method of allowing the division of data to allow parallel decoding without adding extra data would be advantageous, and various types of Huffman coding and decoding processes have been published, but do not disclose this invention.

U.S. Pat. No. 5,386,213 (Haupt et al.) discloses a coder and decoder apparatus for a data transmission system. The variable length coded data is arranged in blocks having a predetermined average length. Blocks which are not full are filled with data from other blocks.

U.S. Pat. No. 5,239,308 (Kessen) discloses a method of processing coded digital signals which are segmented into variable words. The variable length words are allocated to fixed length blocks. The fixed length blocks having a word length shorter than the predetermined word length are filled up with portions of variable length words having a word length longer than the predetermined word length.

U.S. Pat. No. 5,140,322 (Sakagami) discloses a method of transmitting variable word length coded data. The variable length code words are connected until a predetermined number of bits have been connected. The connected data can then be transmitted.

U.S. Pat. Nos. 5,379,116 (Wada et al.) and 4,963, 867 (Bertrand) disclose methods of packing variable length coded data into fixed length packets.

SUMMARY OF THE INVENTION

The type of data word to be coded by this Huffman code system is assumed in this description to have a number of leading zeros and a data portion. Thus, to use a numerical example, an input word may be 0000 0101. This word can be thought of as a number of leading zeros, known as the run, (5 bits), a data pattern having a number of bits, the size, (3 bits), and the bit pattern (101). Using this system, this data word can be described as 5,3,101. The first two parts of this number, the run and size can now be applied to a typical Huffman coder, which assigns the smallest codes to the most often used inputs, to generate the first part of the actual code word. Again, to use this same numerical example, the code word would be a number of bits, such as 100, and would be the coded equivalent of 5,3. Next, the actual bit pattern (101) is added to the first part of the code word, to make the completed code wrod, 100101.

In the decoder, the opposite process is performed. The pattern 100 is used to address a look up table, the output of which will be 5,3, and the pattern is used to generate the final decoded number having 5 leading zeros and a three bit pattern 101, making the final word 0000 0101, which is the same as the original input. In this example the input word is 8 bits and the code word is 6 bits so there is some compression. Input words having long runs of zeros will have a greater amount of compression, while input words that are short and uncommon will compress poorly, or may even be expanded. Finally, the number of bits in a code word can vary widely.

These code words are output from the coder in a string and can be labeleled H1D1, H2D2, etc. It follows that H1D1, H3D3, etc are odd code words and H2D2, H4D4, etc, are even code words. These are separated into two lists with the odd list having H1D1, H3D3, etc and the even list having H2D2, H4D4, etc. It is in this form that the data can be stored or transmitted, finally reaching the decoder.

Huffman decoding is normally accomplished at a rate of one word for each two clocks. The code words are received in a continuous stream of binary bits, and the decoder initially does not know how many of them in the input register belong to the first code word. The first step, during the first clock time, is to look at the bits being received and decide how many of them are in the first code word. During the second clock time these first word bits can be decoded and the data in the register can be shifted to present the decoder with a new full set of input bits again.

In order to get one output word for each clock pulse, two decoders can run in parallel, but this normally requires a time delay or tag bits. This invention solves the problem by running the two lists of words, odd and even through two decoders that are offset by one clock pulse. That way, no buffering, time delay or tag bits are required. Specifically, while one decoder is decoding, the other decoder is shifting. Thus, there is a decoded output word on every clock.

This is an attractive method of Huffman compression partly because it is transparent to the user. The data is output by a terminal or scanner and is received by the printer on a one-word-per-clock basis with the intermediate compression details being completely invisible to the rest of the system.

DETAILED DESCRIPTION OF THE INVENTION

A major bottleneck in designing higher speed electronic systems such as color printers is increasing the performance of the compression decoder. Increasing this performance can result in an unacceptably complex design, and requires a high speed clock. The reason for this is that a table lookup, which normally requires one clock period, and shift operation, which normally requires another clock period, has to be accomplished in one clock, and can not be pipelined.

The traditional solution is to use parallel decompressors, each operating on a separate band of the compressed image. This, however, requires that the software partition the raw image into bands, and compress each band separately, each with its own boundary marker code. Also, there must be a complex system of ping pong buffers to allow two decompressors that are operating at half speed to continuously supply output data in one continuous stream at full speed. This invention presents an alternative solution of allowing parallel decoders but without having to divide the image into tagged or coded bands. The result is one output per clock cycle, which makes the remainder of the system less complex.

The compressed data stream, ignoring markers or stuffed bytes, consists of codes H1D1 . . . HjDj . . ., where HjDj represents the Huffman code bits Hj and appended data, if any, D j. The encoded image is in principle a linear list of these segments (HjDj . . .), which must be decoded in series, since the next Huffman (entropy) segment cannot be located until the preceeding one is decoded. This precludes the use of parallel decoders unless the raw image is encoded into separate bands, each with an RST marker.

In this invention, when encoding the image, the encoder arranges the compressed data into two separate linear lists of odd and even entropy encoded lists, list 1 being H1D1, H3D3, . . . and list 2 being H2D2, H4D4, . . . , where list 1 is every odd entropy segment and list 2 is every even segment. In this embodiment the code words may be from 4 to 26 bits in length, joined together into continuous strings of bits and packed into 32 bit words. Each list can be decoded separately by using two parallel decoders. If, for example, the compressed data bus width is 4 bytes wide, then the odd 4 byte words, list 1, are aligned and encoded separately from the even words, list 2. The decoders also decode the lists separately, and the decoded data is then merged and can be fed into a common high speed printing engine.

This technique is transparent to the user since no additional software, no partitioning of the image and no special insertion of separation codes are required.

Figure 1:
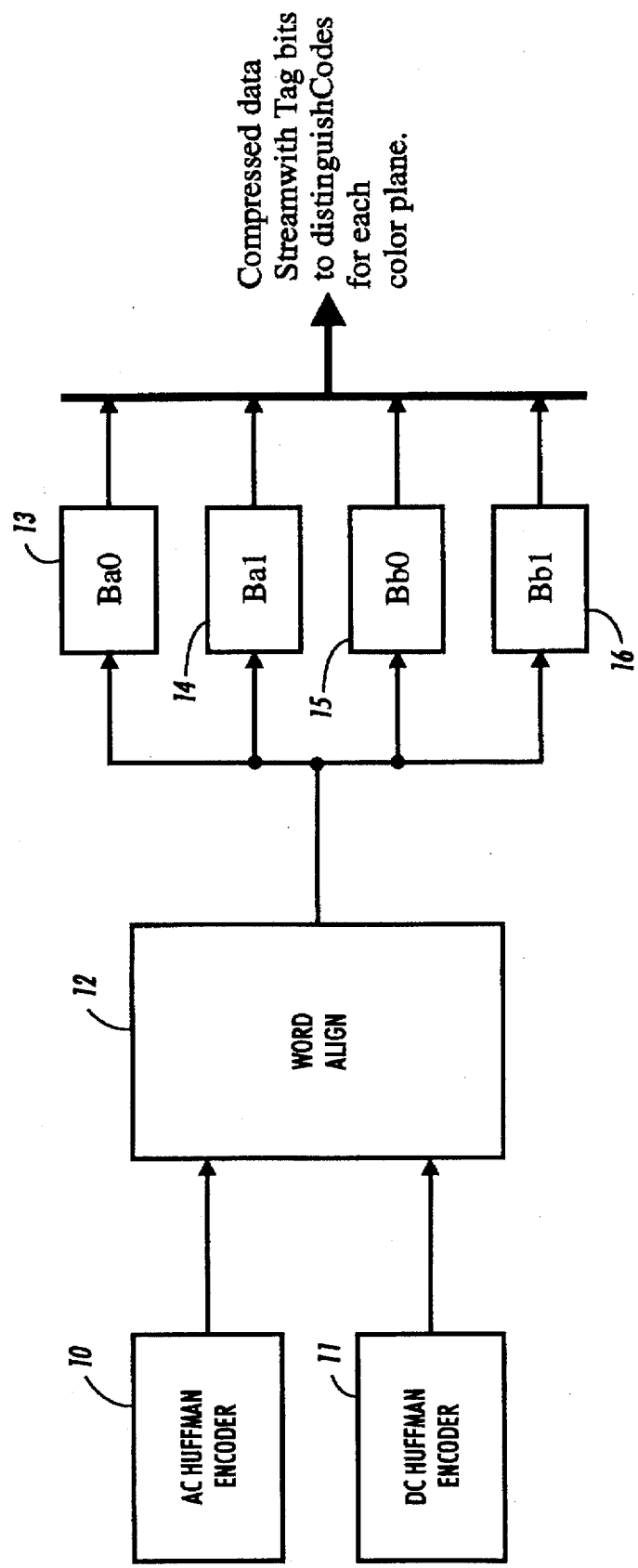
FIG. 1 is a block diagram of the coder.

FIG. 1 is a block diagram of the encoder. Image data to be encoded is delivered through a predictor to maximize the length of zero strings to the two decoders 10, 11. The first pixel in each data block is encoded differently from the remainder and is encoded in encoder 11. The remainder of the data is encoded in encoder 10. The code words thus produced, which comprise the Huffman code bits, denoting run and size, and the data bits, denoting the actual bit pattern, are coupled to the word align block 12 where the first code word is placed first in the string, and the string is then separated into odd and even lists of code words, each of which is integrated into a continuous string of binary bits and output onto a 32 bit bus to a series of eight word by 32 bit ping pong buffers 13 through 16. In the first cycle, the first eight 32 bit words of even code are loaded into buffer 13, and the first eight words of odd code are loaded into buffer 15. In the second cycle, the data within buffers 13 and 15 are sent to memory (or are transmitted) and buffers 14 and 16 are loaded.

Figure 2:
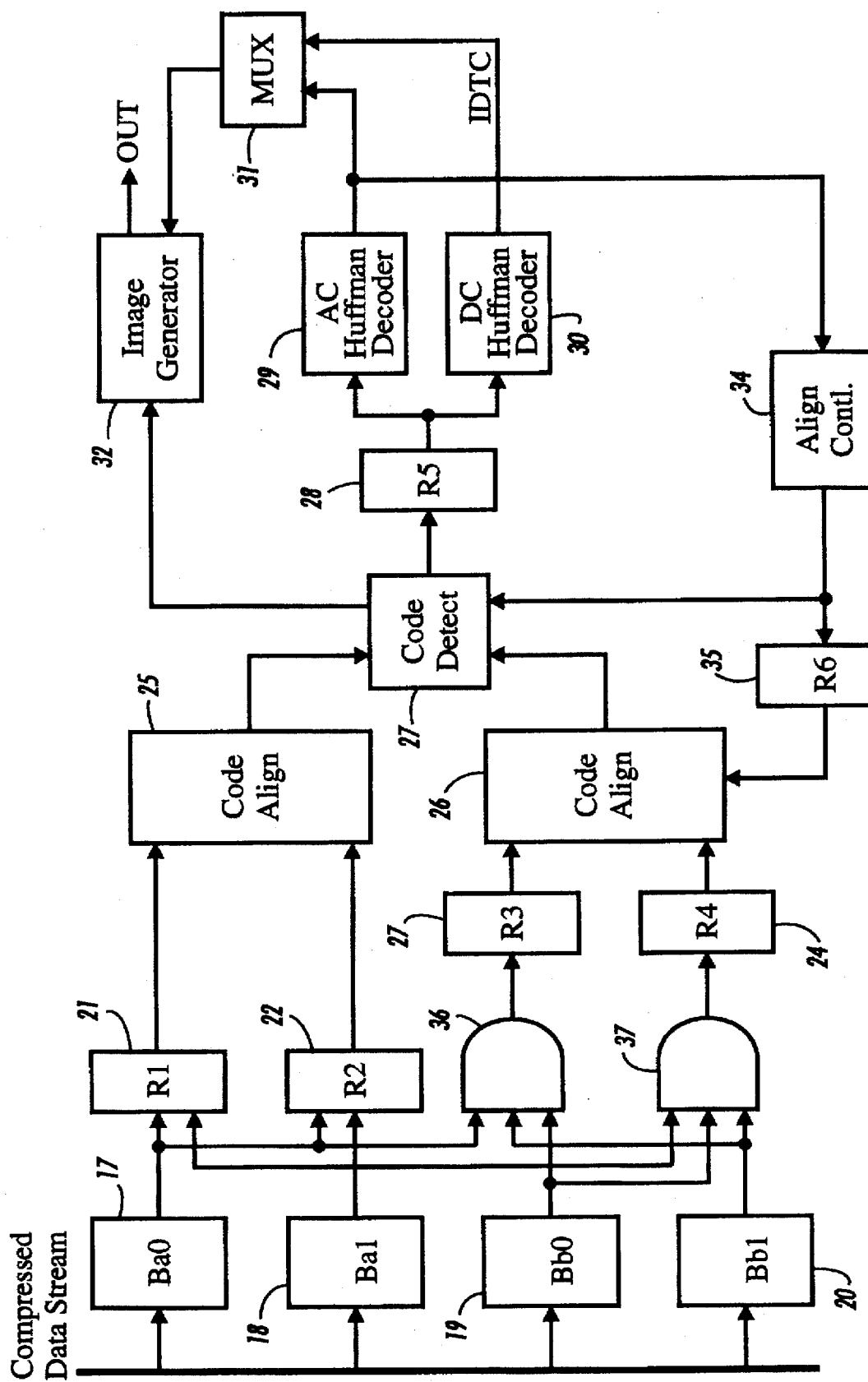
FIG. 2 is a block diagram of the decoder.

The coded data in memory can now be decoded using the decoder circuit of FIG. 2. Here again, to transfer data between memory and the remainder of the decoder, there are four ping pong buffers, each of eight words by 32 bits, two for the even words 17, 18 and two for the odd 19, 20. The even buffers 17, 18 feed one word at a time to ping pong registers 21, 22, each of which can store one 32 bit word, which feed a constant supply of bits to the even code align block 25 which aligns the words into the proper order and sends the resultant string of bits to the even side of the code detect block 27. Similarly, the odd registers 23, 24 send odd code through the odd code align block 26 to the other side of the code detect block 27.

On the even side of the code detect block 27 the current string of bits equal in length to the length of the largest code word is sent to a content addressable memory containing all of the possible Huffman portions of the code words. One of the content addressable memory locations will be accessed, and an 8 bit address will result. This is temporarily stored in buffer register 28 and is then used as an address in the AC Huffman decoder 29 look up table to generate an output of up to 8 bits which constitute run and size descriptions. In case the word being processed is the first word, the DC decoder 30 will be used. A multiplexer 31 selects the output of decoder 30 for the first output and the remainder from decoder 29. Both odd and even sides of the code detecter 27 are identical except that they operate out of phase so that one side is detecting while the other side is shifting.

The output of the multiplexer 31 now contains the run and size information , but is still lacking the data pattern. This is supplied by the code detector 27 to the adder 32. The process is for the output of the decoders 29, 30 to be sent through the align control block 34 to the decoder 27. The decoder adds the number of bits it has determined to be in the Huffman part to the number of bits specified by the size portion of the decoder 29 output, and uses that total as determining how many bits to shift to get the next code word completely shifted in. Further, the actual data in the data portion of the code is sent from the decoder 27 to the image generator 32 where it is added onto the Huffman portion. The complete code word containing run, size and data parts is now used to generate the original image data, in its correct order. Finally, the run/size information output by the align block 34 is sent through timing register 35 to the code align blocks 25, 26 so that new data, 4 to 16 bits, will be supplied to the detector 27 as the previous data is consumed.

Figure 3:
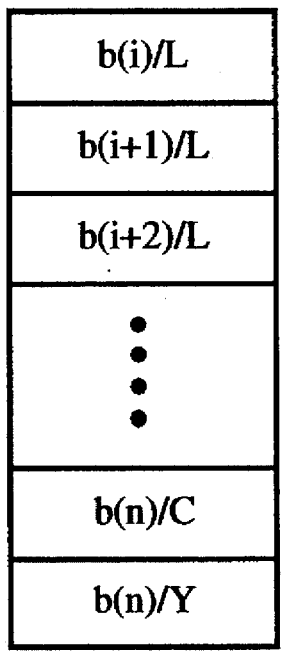
FIG. 3 shows the compressed data format for lab color.
Figure 3:
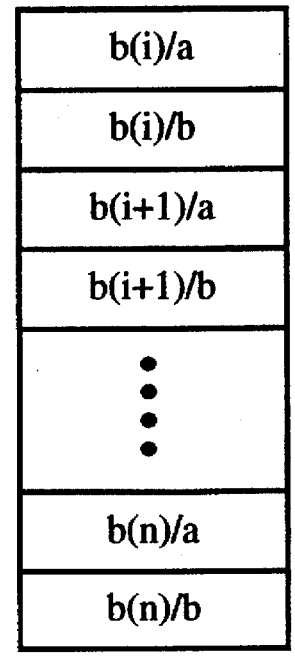

This same basic circuit, which can be used to separately decode odd and even words, can also be used for decoding color data on the Lab color space space by dividing the data into one list of L terms and another list of a and b terms. For decompression to proceed properly, the stored compressed data format for Lab terms must be as shown in FIG. 3 In this case the L terms are decoded, see FIG. 2, in one decoder 29, and the a and b terms are decoded in the other 30. The timing of the decoding process is that at t1, the L component goes through the code detection logic 27. Then at time t2, the code of L is decoded at decoder 29 while the a and b components go through the code detection logic 27. Next, at time t3, the ab components are decoded and another L term is detected at the detector 27, etc. For the a and b terms to be decoded in parallel, the decoder 30 must be divided into two decoders, operating in parallel. The result is the output of either an L term or a and b terms, one byte in either case, per clock cycle.

Figure 4:
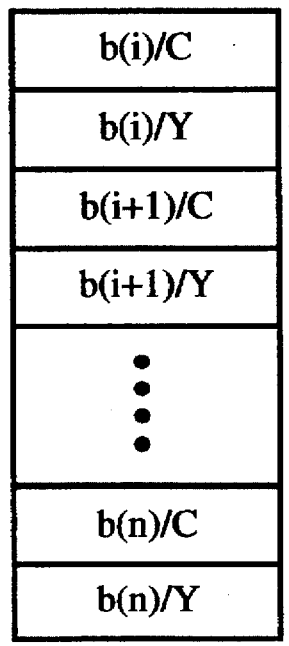
FIG. 4 shows the compressed data format for CMYK color.
Figure 4:
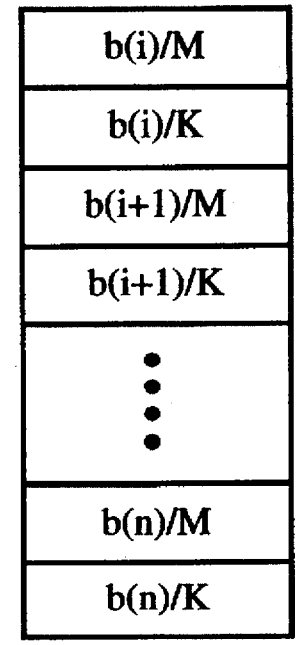

For color data in the CMYK space only one decoder is needed, and the data must be compressed as shown in FIG. 4. The timing sequence is as follows. At time t1 the C code is coupled from the code align buffer 25 to the detector and is detected. At time t2 the C code is decoded and the M component is coupled in from the other buffer 26. At time t3 the M code is decoded and and the Y component is coupled in to the detector 27 from buffer 25, etc. In this case there is a C, Y, M or K byte output every clock cycle.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. The method of cyclically using two channels to decode an input comprising a continuous string of encoded words, each comprising a Huffman code which is encoded from the number of leading zeros and the number of bits in the data pattern, and the data pattern itself, comprising the steps of: in each channel, a. on a first clock cycle, determining the number of bits in the current Huffman code, and b. on a second cycle, decoding the current Huffman code to determine the number of bits in the data pattern and shifting the input string of encoded words by the number of bits in the current Huffman code plus the number of bits in the current data pattern to determine the position of the next encoded word, and wherein one channel is on its first clock cycle while the other channel is on its second clock cycle, so that the input string of encoded words is shifted on every clock cycle.

* * * * *